(12) United States Patent
Iwaki

(10) Patent No.: US 7,989,694 B2
(45) Date of Patent: Aug. 2, 2011

(54) PHOTOELECTRIC CONVERSION ELEMENT, SOLAR BATTERY, AND PHOTO SENSOR

(75) Inventor: Yuji Iwaki, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 587 days.

(21) Appl. No.: 11/292,262

(22) Filed: Dec. 1, 2005

(65) Prior Publication Data

US 2006/0118166 A1 Jun. 8, 2006

(30) Foreign Application Priority Data

Dec. 6, 2004 (JP) ................................ 2004-353437

(51) Int. Cl.
*H01L 31/00* (2006.01)
(52) U.S. Cl. ........ 136/263; 136/252; 136/255; 136/256; 429/111; 438/57; 438/63
(58) Field of Classification Search .................. 136/263, 136/252, 255, 266; 429/111; 438/57, 63
See application file for complete search history.

(56) References Cited

U.S. PATENT DOCUMENTS

| | | | | |
|---|---|---|---|---|
| 4,272,641 A * | 6/1981 | Hanak | ............................ | 136/249 |
| 4,430,405 A * | 2/1984 | Ono et al. | ........................ | 430/95 |
| 4,740,431 A * | 4/1988 | Little | ................................ | 429/9 |
| 4,927,721 A | 5/1990 | Gratzel et al. | .................. | 429/111 |
| 5,061,979 A * | 10/1991 | Kobayashi et al. | ............ | 136/244 |
| 5,084,365 A | 1/1992 | Gratzel et al. | .................. | 429/111 |
| 5,482,570 A * | 1/1996 | Saurer et al. | ................... | 136/255 |
| 5,783,292 A | 7/1998 | Tokito et al. | | |
| 6,091,382 A | 7/2000 | Shioya et al. | | |
| 6,207,284 B1 * | 3/2001 | Varanasi et al. | ............... | 428/426 |
| 6,340,781 B1 * | 1/2002 | Shields et al. | .................. | 570/177 |
| 6,428,912 B1 * | 8/2002 | Haddon | ......................... | 428/690 |
| 6,653,701 B1 * | 11/2003 | Yamazaki et al. | ............. | 257/414 |
| 2001/0017153 A1 * | 8/2001 | Kubota et al. | .................. | 136/256 |
| 2002/0040728 A1 * | 4/2002 | Yoshikawa | ..................... | 136/263 |
| 2002/0108649 A1 * | 8/2002 | Fujimori et al. | ............... | 136/263 |
| 2003/0013008 A1 * | 1/2003 | Ono | ................................ | 429/111 |
| 2003/0127967 A1 * | 7/2003 | Tsutsui et al. | ................. | 313/498 |

(Continued)

FOREIGN PATENT DOCUMENTS

CN 1086049 4/1994

(Continued)

OTHER PUBLICATIONS

Chinese Office Action (Application No. 200510128899.6) dated Feb. 6, 2009.

(Continued)

*Primary Examiner* — Alexa D Neckel
*Assistant Examiner* — Golam Mowla
(74) *Attorney, Agent, or Firm* — Husch Blackwell LLP

(57) ABSTRACT

The invention provides a photoelectric conversion element and a solar battery having the photoelectric conversion element each of which has a structure with a high carrier generating rate. Further, the invention provides a photoelectric conversion element and a solar battery having the photoelectric conversion element of which high energy converting efficiency. According to the invention, the photoelectric conversion element and the solar battery having the photoelectric conversion element are characterized in that a pair of electrodes sandwich a mixed layer including a charge generating layer and a charge acceptor layer. The charge generating layer is formed of a first organic compound and an inorganic compound. The charge acceptor layer is formed of a second organic compound.

17 Claims, 13 Drawing Sheets

U.S. PATENT DOCUMENTS

| | | | |
|---|---|---|---|
| 2003/0164188 A1* | 9/2003 | Murai et al. | 136/263 |
| 2003/0189401 A1* | 10/2003 | Kido et al. | 313/504 |
| 2003/0205268 A1* | 11/2003 | Nakamura et al. | 136/250 |
| 2003/0214246 A1* | 11/2003 | Yamazaki | 315/169.3 |
| 2003/0234609 A1 | 12/2003 | Aziz et al. | |
| 2004/0084080 A1* | 5/2004 | Sager et al. | 136/263 |
| 2004/0118448 A1* | 6/2004 | Scher et al. | 136/252 |
| 2005/0084712 A1 | 4/2005 | Kido et al. | |
| 2005/0098207 A1 | 5/2005 | Matsumoto et al. | |
| 2005/0170208 A1 | 8/2005 | Yatsunami et al. | |
| 2005/0248267 A1 | 11/2005 | Gyoutoku et al. | |
| 2006/0008740 A1 | 1/2006 | Kido et al. | |
| 2006/0076050 A1* | 4/2006 | Williams et al. | 136/263 |
| 2006/0214158 A1 | 9/2006 | Hirakata et al. | |
| 2007/0200125 A1* | 8/2007 | Ikeda et al. | 257/94 |

FOREIGN PATENT DOCUMENTS

| | | |
|---|---|---|
| EP | 1524706 | 4/2005 |
| EP | 1530245 | 5/2005 |
| EP | 1617493 | 1/2006 |
| JP | 01-220380 | 9/1989 |
| JP | 08-078329 | 3/1996 |
| JP | 09-063771 | 3/1997 |
| JP | 11-307259 | 11/1999 |
| JP | 2005-026121 | 1/2005 |
| JP | 2005-251587 | 9/2005 |
| WO | WO-2005/031798 | 4/2005 |

OTHER PUBLICATIONS

Tang, C.W., "Two-Layer Organic Photovoltaic Cell," Applied Physics Letters, vol. 48, No. 2, Jan. 13, 1986, pp. 183-185.

Office Action re Chinese application No. CN 200510128899.6, dated Mar. 1, 2010 (with English translation).

* cited by examiner

FIG. 12A NPB : molybdenum oxide = 1 : 0.25
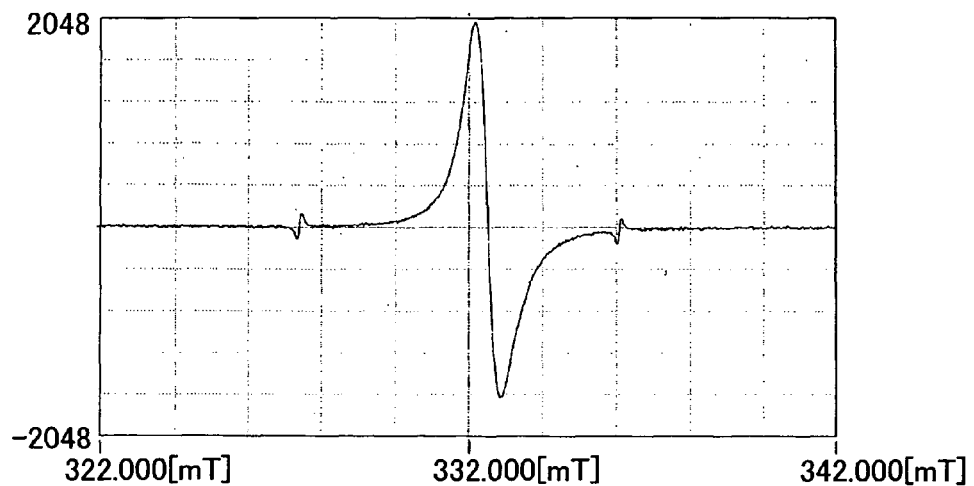
FIG. 12B NPB
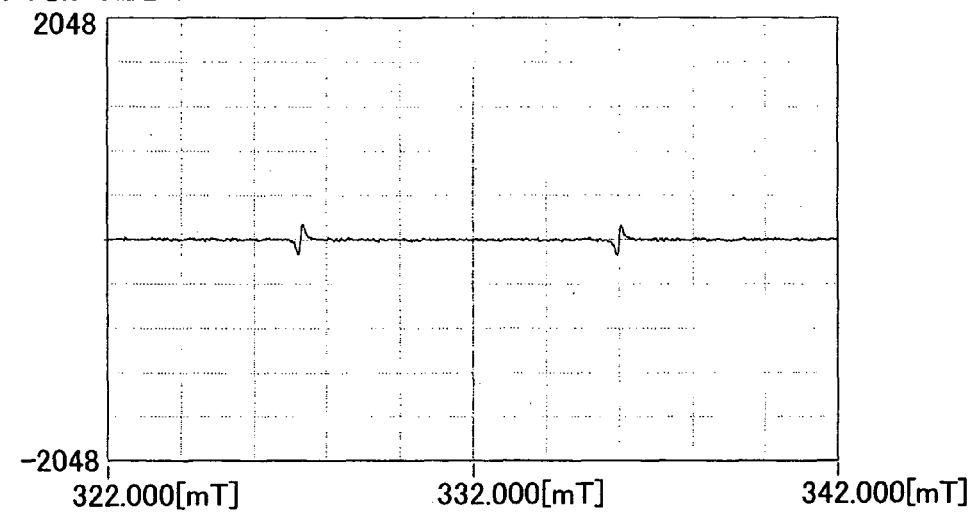
FIG. 12C molybdenum oxide
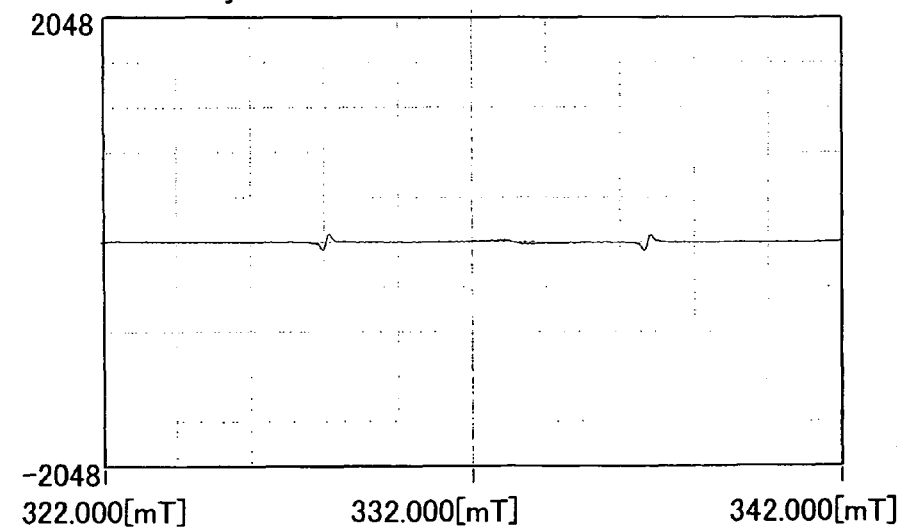

FIG. 13A DNTPD : molybdenum oxide = 1 : 0.5
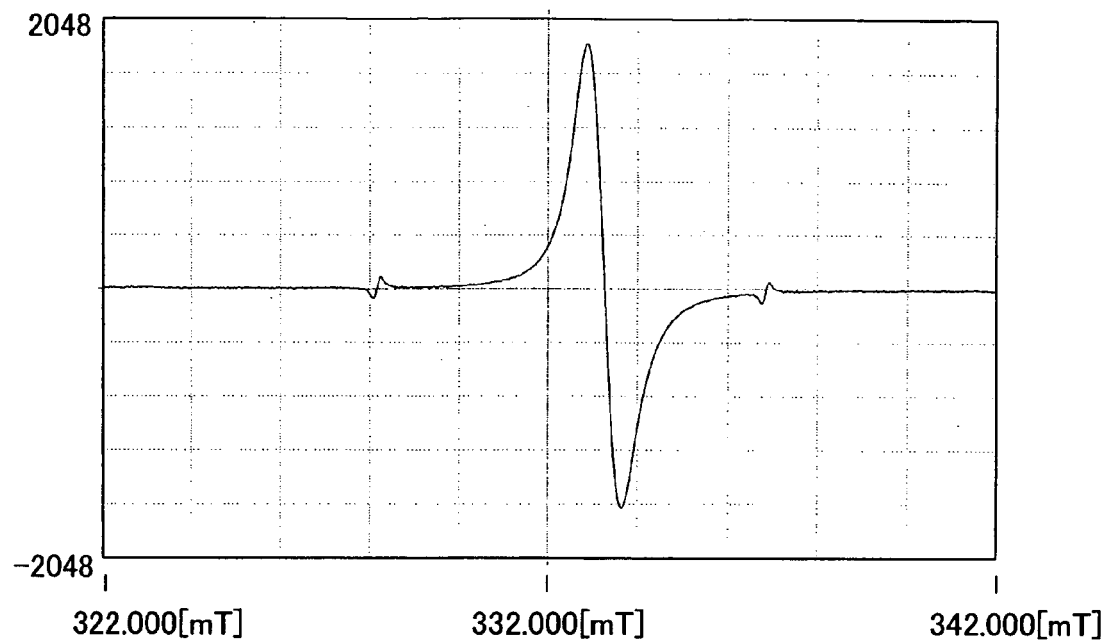
FIG. 13B DNTPD
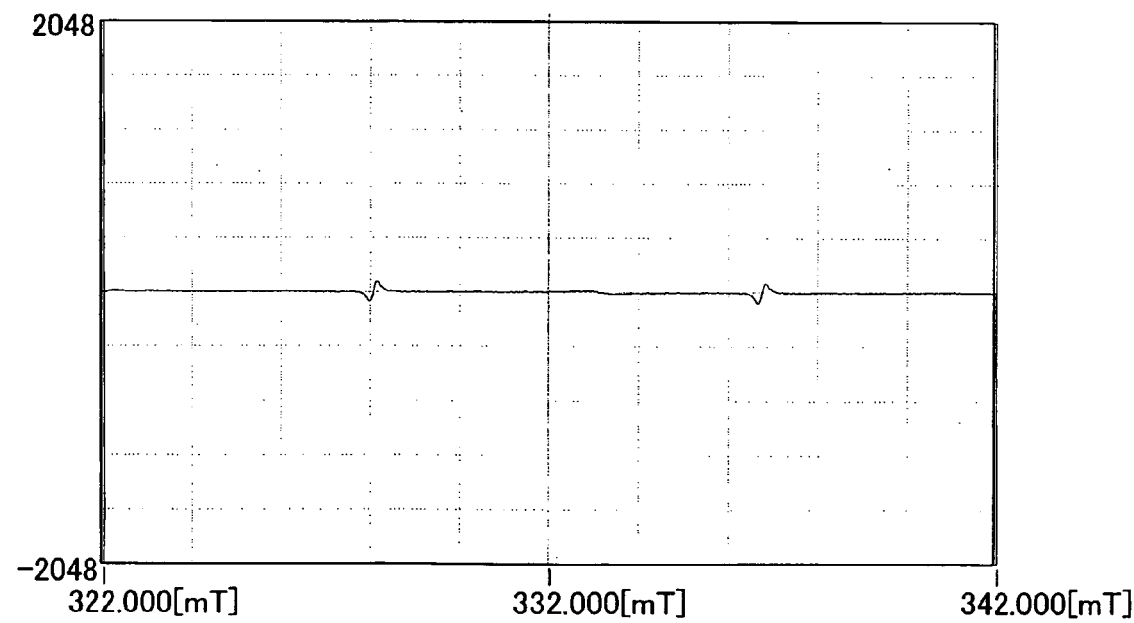

PHOTOELECTRIC CONVERSION ELEMENT, SOLAR BATTERY, AND PHOTO SENSOR

BACKGROUND OF THE INVENTION

1. Field of the Invention

The present invention relates to a photoelectric conversion element, a solar battery, and a photo sensor.

2. Description of the Related Art

As a photoelectric conversion element and a solar battery having the photoelectric conversion element which convert an optical energy into an electrical energy, a single crystalline silicon solar battery as a first generation, a polycrystalline silicon solar battery formed of a number of crystals as a second generation, and a compound semiconductor solar battery using gallium arsenic and the like as a third generation have been suggested, although they have many problems in cost and the like. In view of this, a solar battery formed of an organic semiconductor is suggested.

An organic semiconductor solar battery is typically a dye thin film solar battery and a dye-sensitization solar battery. A dye thin film solar battery has a p-n heterojunction structure using a perylene derivative as an n-type dye and copper phthalocyanine as a p-type dye.

On the other hand, a dye-sensitization solar battery is called a fourth generation battery and is actively being researched as a photoelectric conversion element which is inexpensive and can provide high conversion efficiency. A dye-sensitization solar battery is a wet type solar battery, in which a semiconductor electrode obtained by adding a photo sensitization dye to porous titanium dioxide thin film so as to be held therein is provided as a work electrode, then the semiconductor electrode is immersed in an electrolyte solution, and an opposite electrode is formed (for example, see Patent Document 1).

A ruthenium complex having an absorption in a visible light region is used as the photo sensitization dye. The electrolyte solution is obtained by adding iodine to a mixture solution of acetonitrile and ethylene carbonate. When the photo sensitization dye is photoexcited, an electron is injected from the photo sensitization dye to a titania semiconductor electrode as the work electrode. On the other hand, a hole oxidizes the electrolyte solution having a hole transporting property and the oxidized electrolyte solution having a hole transporting property receives an electron from the opposite electrode. A solar battery operates by the aforementioned procedure continuously carried out.

The dye sensitization solar battery is different from the p-n heterojunction solar battery in that only an electron is injected to an electrode. Therefore, there are advantages in that a recombination of an electron and a hole does not easily occur and charge separation occurs efficiently. Accordingly, conversion efficiency from an optical energy into an electrical energy exceeds 10%.

[Patent Document 1]
Japanese Patent Laid-Open No. Hei 1-220380

SUMMARY OF THE INVENTION

However, the dye thin film solar battery is disadvantageous in that conversion efficiency from an optical energy into an electrical energy only exceeds 1% and that conversion efficiency is low.

The dye sensitization solar battery of which conversion efficiency from an optical energy into an electrical energy exceeds 10% has been developed, however, there is a disadvantage in that a ruthenium atom as a central metal of the ruthenium complex which is favorable as a sensitization dye is a scarce resource and that the cost is increased accordingly.

Further, the organic semiconductor solar battery has been developed in many ways for efficient photo induced electron transfer, such as controlling a HOMO level and a LUMO level of a p-type organic semiconductor and an n-type organic semiconductor respectively and controlling the mixture of the heterojunction interface so as to widen a carrier generating site. Still, the carrier generating rate is not high enough.

In view of the aforementioned, the invention provides a photoelectric conversion element and a solar battery having the photoelectric conversion element each of which has a structure with a high carrier generating rate. Further, the invention provides a photoelectric conversion element and a solar battery having the photoelectric conversion element with high energy converting efficiency.

The invention provides a photoelectric conversion element and a solar battery having the photoelectric conversion element each of which includes an organic/inorganic mixed layer in which a charge acceptor layer is stacked over a charge generating layer formed of an inorganic compound and an organic compound.

That is, according to the invention, each of a photoelectric conversion element and a solar battery having the photoelectric conversion element each of which has a pair of electrodes which sandwich a mixed layer including a charge generating layer and a charge acceptor layer. The charge generating layer is formed of a first organic compound and an inorganic compound while the charge acceptor layer is formed of a second organic compound.

According to a first structure of the invention, the first organic compound which forms the charge generating layer is preferably an organic compound having a hole transporting property, and more preferably an organic compound having an aromatic amine skeleton.

At this time, it is preferable to use as the inorganic compound a metal oxide or a metal nitride showing an electron accepting property to the organic compound having a hole transporting property, and more preferably an oxide of a transition metal belonging to any one of groups 4 to 10 of the periodic table is used. Among them, an oxide of a transition metal belonging to any one of groups 4 to 8 of the periodic table mostly has a high electron accepting property. In particular, a metal oxide such as molybdenum oxide, vanadium oxide, ruthenium oxide, and rhenium oxide is preferably used. Besides, a metal oxide such as a titanium oxide, chromium oxide, zirconium oxide, hafnium oxide, tantalum oxide, tungsten oxide, and silver oxide may also be used.

Further, it is preferable to use an organic compound having an electron transporting property as the second organic compound which forms the charge acceptor layer, and more preferably a chelate metal complex having a chelate ligand containing an aromatic ring, an organic compound having a phenanthroline skeleton, an organic compound having an oxadiazol skeleton, a perylene derivative, a naphthalene derivative, quinones, methyl viologen, fullerene, and the like are used.

According to a second structure of the invention, an organic compound having an electron transporting property is preferably used as the first organic compound which forms the charge generating layer, and more preferably a chelate metal complex having a chelate ligand containing an aromatic ring, an organic compound having a phenanthroline skeleton, an organic compound having an oxadiazole skeleton, a perylene derivative, a naphthalene derivative, quinones, methyl viologen, fullerene, and the like are used.

At this time, it is preferable to use a metal oxide or a metal nitride showing an electron donating property to the first organic compound, and more preferably an alkali metal oxide, an alkaline earth metal oxide, a rare earth metal oxide, an alkali metal nitride, an alkaline earth metal nitride, and a rare earth metal nitride are used as the inorganic compound. These metal oxides and metal nitrides mostly have high electron donating property, which are preferably lithium oxide, calcium oxide, sodium oxide, barium oxide, lithium nitride, magnesium nitride, calcium nitride and the like.

The organic compound which forms the charge acceptor layer is preferably an organic compound having a hole transporting property, and more preferably an organic compound having an aromatic amine skeleton.

According to the invention, a photoelectric conversion element and a solar battery having the photoelectric conversion element are provided in which a mixed layer including a pair of electrodes which sandwich a first charge generating layer and a second charge generating layer. The first charge generating layer is formed of a first organic compound and a first inorganic compound. The second charge generating layer is formed of a second organic compound and a second inorganic compound.

The first organic compound which forms the first charge generating layer is preferably an organic compound having a hole transporting property, and more preferably an organic compound having an aromatic amine skeleton.

At this time, the first inorganic compound is preferably a metal oxide or a metal nitride, and more preferably an oxide of a transition metal belonging to any one of groups 4 to 10 of the periodic table. Among them, an oxide of a transition metal belonging to any one of groups 4 to 8 of the periodic table mostly has a high electron accepting property. In particular, a metal oxide such as vanadium oxide, molybdenum oxide, rhenium oxide, and tungsten oxide is preferably used.

Further, the second organic compound which forms the second charge generating layer is preferably an organic compound having an electron transporting property, and more preferably a chelate metal complex having a chelate ligand containing an aromatic ring, an organic compound having a phenanthroline skeleton, or an organic compound having an oxadiazole skeleton. At this time, the second inorganic compound is preferably a metal oxide or a metal nitride, and more preferably an alkali metal oxide, an alkaline earth metal oxide, a rare earth metal oxide, an alkali metal nitride, an alkaline earth metal nitride, and a rare earth metal nitride. These metal oxides and metal nitrides mostly have high electron donating property, which are preferably lithium oxide, barium oxide, lithium nitride, magnesium nitride, calcium nitride and the like.

It is to be noted that a photoelectric conversion element and a solar battery having the photoelectric conversion element with high energy conversion efficiency can be provided by providing an amplifier circuit. The amplifier circuits are, for example, a circuit formed of an operational amplifier and a thin film transistor (hereinafter referred to as a TFT) and the like.

According to a photoelectric conversion element and a solar battery having the photoelectric conversion element of the invention, each of the inorganic compound and the organic compound of the charge generating layer becomes a charge separation state as a result of electron transfer caused by light irradiation of natural light, laser light, sunlight or the like with a particular wavelength. On the other hand, a charge transfer complex formed by mixing an inorganic compound and an organic compound is created following excitation by light irradiation, thereby the charge separation state is created. Accordingly, by mixing an inorganic compound and an organic compound, generating efficiency of electrons and holes in a charge separation state can be improved.

Further, by providing a charge acceptor layer so as to be conjugated with the charge generating layer, the electrons and the holes in the charge separation state generated in the charge generating layer can be electron carriers and hole carries to be a photo current. As a result, conversion efficiency from a photo energy to an electrical energy can be enhanced.

As a result, a photoelectric conversion element and a solar battery having the photoelectric conversion element with high energy conversion efficiency can be provided. Further, by using a photoelectric conversion element with high energy efficiency, an optical sensor of which power consumption is suppressed can be realized.

BRIEF DESCRIPTION OF THE DRAWINGS

FIGS. 12A to 12C show electron spin resonance spectra each of which indicates a charge separation.

FIGS. 13A and 13B show electron spin resonance spectra each of which indicates a charge separation.

DETAILED DESCRIPTION OF THE INVENTION

Embodiment Mode 1

Figure 1:
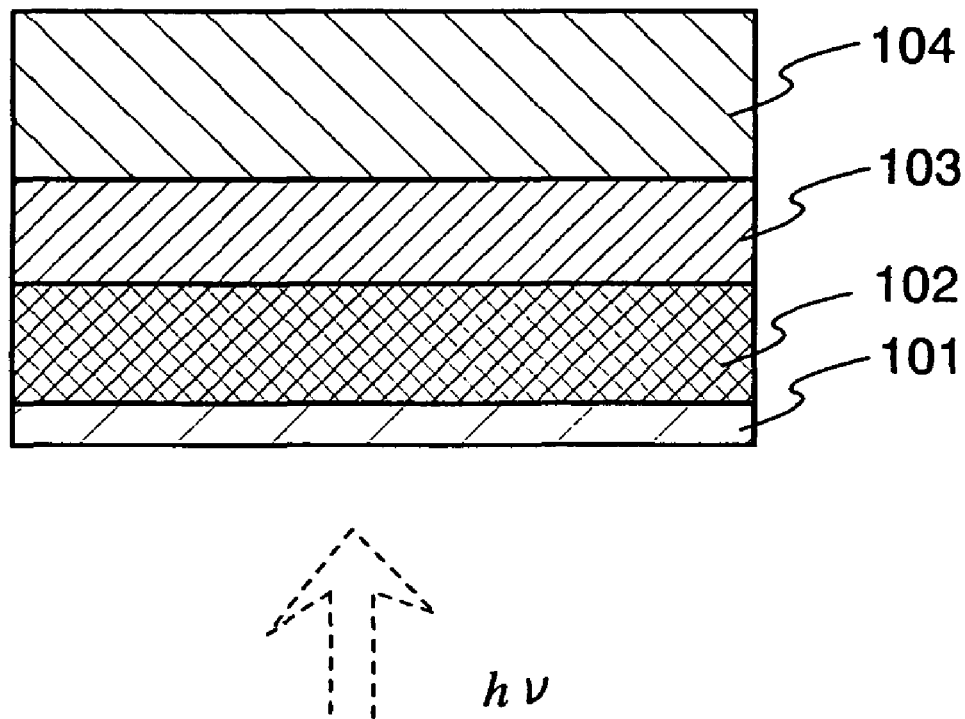
FIG. 1 is a schematic sectional view of a portion of a photoelectric conversion element.

FIG. 1 shows an element structure of a photoelectric conversion element of the invention. Here, a charge generating layer is formed of a layer containing an organic compound and an inorganic compound each of which has a hole transporting property and a charge acceptor layer is formed of an organic compound having an electron transporting property.

The photoelectric conversion element has a stacked-layer structure in which a first electrode 101, a charge generating layer 102, a charge acceptor layer 103, and a second electrode 104 are sequentially stacked.

The first electrode 101 is formed of a material which is conductive and has high light transmissivity against a wavelength region of an incident excited light. The first electrode 101 is formed by a vacuum vapor deposition method, a sputtering method and the like, and a thickness thereof is not limited. It is preferable to use a metal and a metal oxide, in particular Al, indium tin oxide (ITO), $SnO_2$, and $In_2O_3$ containing ZnO which are formed to be thin enough to transmit light.

The charge generating layer 102 is formed of an organic compound having a hole transporting property and an inorganic compound showing an electron accepting property to an organic compound having a hole transporting property. The organic compound having a hole transporting property may be aromatic amine. Typically, phthalocyanine (abbreviated as $H_2$—Pc), copper phthalocyanine (abbreviated as Cu—Pc), vanadyl phthalocyanine (abbreviated as VOPc), 4,4'-bis[N-(1-naphthyl)-N-phenyl-animo]-biphenyl (abbreviated as α-NPD), 4,4',4"-tris(N,N-diphenyl-amino)-triphenylamine (abbreviated as TDATA), 4,4',4"-tris[N-(3-methylphenyl)-N-phenyl-amino]-triphenylamine (abbreviated as m-TDATA), 4,4',4"-tris[N-(3-methylphenyl)-N-phenylamino]-triphenylamine (abbreviation: MTDATA), 1,3,5-tris[N,N-di(m-tolyl)amino]benzene (abbreviation: m-MTDAB), N,N'-diphenyl-N,N'-bis(3-methylphenyl)-1,1'-biphenyl-4,4'-diamine (abbreviation: TPD), 4,4'-bis[N-(1-naphthyl)-N-phenylamino]biphenyl (abbreviation: NPB), 4,4'-bis{N-[4-di(m-tolyl)amino]phenyl-N-phenylamino}biphenyl (abbreviation: DNTPD), and 4,4',4"-tris(N-carbazolyl)triphenylamine (abbreviation: TCTA) and the like may be used, although the invention is not limited to these. Among the aforementioned compounds, an aromatic amine compound typified by α-NPD, TDATA, MTDATA, m-MTDAB, TPD, NPB, DNTPD, TCTA and the like easily generates a hole carrier and is preferable to be used as the first organic compound.

The inorganic compound showing an electron accepting property to the organic compound having a hole transporting property is preferably a metal oxide or a metal nitride, and more preferably an oxide of a transition metal belonging to any one of groups 4 to 10 of the periodic table. Among them, an oxide of a transition metal belonging to any one of groups 4 to 8 of the periodic table mostly has a high electron accepting property. In particular, a metal oxide such as molybdenum oxide, vanadium oxide, ruthenium oxide, and rhenium oxide is preferably used. Besides, a metal oxide such as titanium oxide, chromium oxide, zirconium oxide, hafnium oxide, tantalum oxide, tungsten oxide, and silver oxide may also be used.

The charge generating layer 102 is appropriately formed by a co-deposition method, an application method, a sol-gel method and the like. By increasing a mol rate of the inorganic compound to the organic compound, an absorbance in the charge transfer region increases. That is, more molecules tend to be excited, however, a charge transporting property depends on the combination of an organic compound and an inorganic compound. Therefore, the mol rate is to be determined appropriately. The thickness of the charge generating layer 102 is preferably 30 to 50 nm.

The charge acceptor layer 103 is preferably formed with a thickness of 30 to 50 nm by the co-deposition method, the application method, the sol-gel method and the like appropriately. The charge acceptor layer 103 is preferably formed of an organic compound having an electron transporting property. As a representative, an organic compound having an electron transporting property is preferably used, and more preferably a chelate metal complex having a chelate ligand containing an aromatic ring, an organic compound having a phenanthroline skeleton, an organic compound having a oxadiazol skeleton, a perylene derivative, a naphthalene derivative, quinones, methyl viologen, fullerene, and the like are used. In specific, tris(8-quinolinolato)aluminum (abbreviated as $Alq_3$), tris(4-methyl-8-quinolinolato)aluminum (abbreviated as $Almq_3$), bis(10-hydroxybenzo)[h]-quinolinato)beryllium (abbreviated as $BeBq_2$), bis(2-methyl-8-quinolinolato)-4-phenylphenolato-aluminum (abbreviated as BAlq), bis [2-(2'-hydroxyphenyl)-benzoxazolate]zinc (abbreviated as $Zn(BOX)_2$), bis [2-(2'-hydroxyphenyl)-benzothiazolate]zinc (abbreviated as $Zn(BTZ)_2$), bathophenanthroline (abbreviated as BPhen), bathocuproin (abbreviated as BCP), 2-(4-biphenylyl)-5-(4-tert-butylphenyl)-1,3,4-oxadiazole (abbreviated as PBD), 1,3-bis[5-(4-tert-butylphenyl)-1,3,4-oxadiazole-2-yl]benzene (abbreviated as OXD-7), 2,2', 2"-(1,3,5-benzenetriyl)-tris(1-phenyl-1H-benzimidazole (abbreviated as TPBI), 3-(4-biphenylyl)-4-phenyl-5-(4-tert-butylphenyl)-1,2,4-triazole (abbreviated as TAZ), 3-(4-biphenylyl)-4-(4-ethylphenyl)-5-(4-tert-butylphenyl)-1,2,4-triazole (abbreviated as p-EtTAZ) and the like may be used, although the invention is not limited to these. Further, among the aforementioned compounds, a perylene derivative, a naphthalene derivative, quinones, methyl viologen, fullerene and the like easily generate electron carriers and favorable to be used as the charge acceptor layer.

Figure 4A:
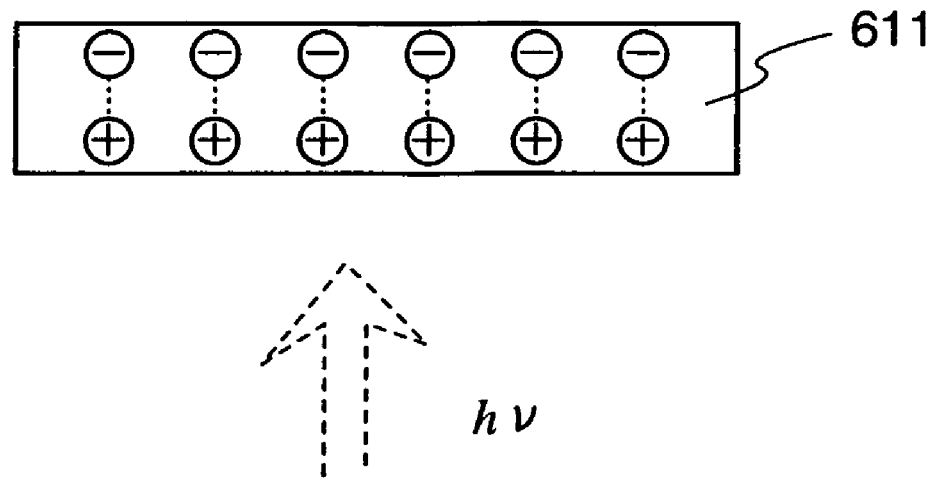
FIGS. 4A and 4B are schematic diagrams of a charge separation procedure.

The charge generating layer formed of an organic compound and an inorganic compound becomes a charge separation state by light irradiation. By providing a charge acceptor layer for the charge generating layer in the charge separation state, a charge separated in the charge generating layer can be used as a carrier. Hereinafter description is made in details with reference to FIGS. 4A and 4B.

In a charge generating layer formed of an organic compound and an inorganic compound, that is a mixed layer in which molybdenum oxide and α-NPD are mixed here, it is considered that molybdenum oxide and α-NPD form a charge transfer complex in a ground state. This is obvious from that absorption spectrum of the mixed layer in which molybdenum oxide and α-NPD are mixed has a third absorbance which is different than a first absorbance based on a locally excited state of molybdenum oxide and a second absorbance based on a transition into a locally excited state of α-NPD.

The locally excited state is a state that an excited electron and a hole are paired in one molecule to form an exciton. If an electron donor or an electron acceptor is not adjacent in a molecule in the locally excited state, deactivation of radiation and heat occurs in the molecule, and thus the molecule goes back to the ground state. On the other hand, in a region where molybdenum oxide and α-NPD are adjacent, an electron is given and received between α-NPD in the excited state and molybdenum oxide in the ground state. As a result of such electron transfer by photoexcitation, a first charge separation state in which electrons and holes are separated is obtained.

On the other hand, a charge transfer complex formed of molybdenum oxide and α-NPD becomes a second charge separation state by photoexcitation.

In this manner, it is considered that there are aforementioned two procedures for the mixed layer in which molybdenum oxide and α-NPD are mixed becomes a charge separation state. By the charge separation, a mixed layer 611 of molybdenum oxide and α-NPD having a hole transporting property becomes a state in which electrons stagnate in the mixed layer (see FIG. 4A).

Figure 4B:
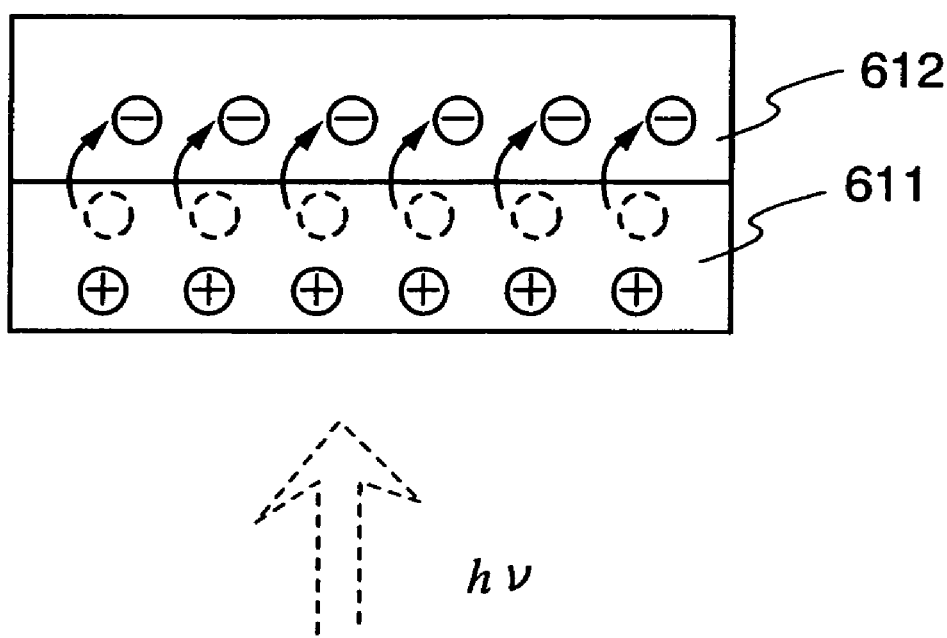

In view of the aforementioned, a charge acceptor layer 612, that is an electron acceptor layer here is provided so as to be conjugated with the mixed layer 611 formed of molybdenum oxide and α-NPD, thereby the electrons in the mixed layer of molybdenum oxide and α-NPD are pulled out, thereby a current flows therethrough (see FIG. 4B). That is, there are many sites for forming the charge separation state by photoexcitation in the mixed layer of molybdenum oxide and α-NPD. Providing an electron acceptor layer can promote to generate many carriers from the separated charge. As a result, conversion efficiency from an optical energy into an electrical energy can be enhanced.

The second electrode 104 is formed of aluminum, silver, titanium, nickel and the like by a known method such as a vapor deposition method, a sputtering method and the like with a thickness of 10 to 100 nm.

Embodiment Mode 2

Figure 2:
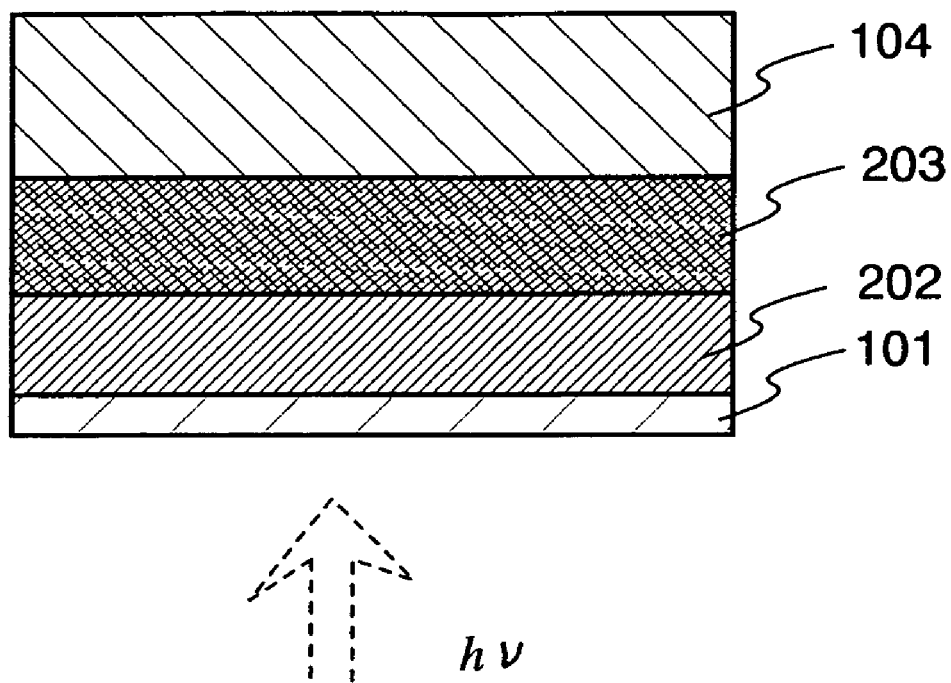
FIG. 2 is a schematic sectional view of a portion of a photoelectric conversion element.

FIG. 2 shows an element structure of a photoelectric conversion element. Here, a charge generating layer is formed of a layer containing an organic compound and an inorganic compound each of which has an electron transporting property and a charge acceptor layer is formed of an organic compound having a hole transporting property.

A charge acceptor layer 202 is formed over the first electrode 101 and a charge generating layer 203 is formed over the charge acceptor layer 202.

The charge generating layer 203 is formed of an organic compound and an inorganic compound each of which has an electron transporting property. The organic compound having an electron transporting property may be formed of the substance having an electron transporting property specifically described in Embodiment Mode 1. The inorganic compound is preferably formed of a metal oxide or a metal nitride each of which shows an electron donating property to the first organic compound, and more preferably an alkali metal oxide, an alkaline earth metal oxide, a rare earth metal oxide, an alkali metal nitride, an alkaline earth metal nitride, and a rare earth metal nitride are used. Typical examples of these metal oxides and metal nitrides are favorably lithium oxide, calcium oxide, sodium oxide, barium oxide, lithium nitride, magnesium nitride, calcium nitride and the like.

The charge acceptor layer 202 is formed of an organic compound having a hole transporting property. The organic compound having a hole transporting property may be formed of the substance having a hole transporting property specifically described in Embodiment Mode 1.

Embodiment Mode 3

Figure 3:
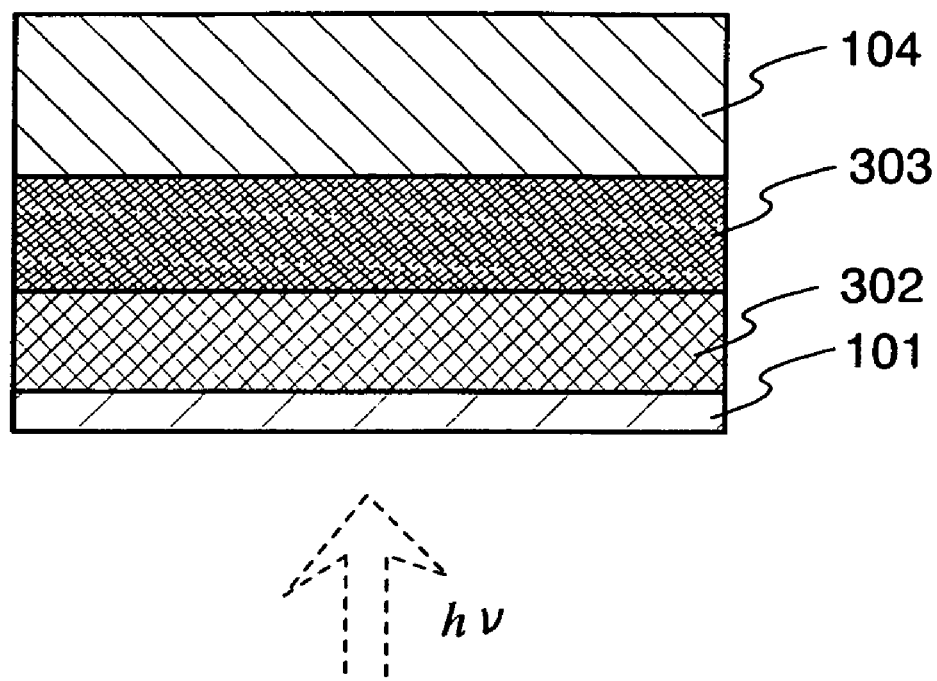
FIG. 3 is a schematic sectional view of a portion of a photoelectric conversion element.

FIG. 3 shows an element structure of a photoelectric conversion element and a solar battery of the invention. Here, a first charge generating layer is formed of a layer containing an organic compound having a hole transporting property and a first inorganic compound. A second charge generating layer is formed of a layer containing an organic compound having an electron transporting property and a second inorganic compound.

A first charge generating layer 302 is formed over the first electrode 101 and a second charge generating layer 303 is formed over the first charge generating layer 302.

The first charge generating layer 302 may be formed of the substance of the charge generating layer 102 specifically described in Embodiment Mode 1. The second charge generating layer 303 may be formed of the substance of the charge generating layer 203 specifically described in Embodiment Mode 2.

Embodiment 1

Here, description is made on a manufacturing method of the photoelectric conversion element and the solar battery described in Embodiment Mode 1.

Over a substrate which transmits light, ITO is formed as a first electrode by the sputtering method and molybdenum oxide $MoO_3$ as a metal oxide and α-NPD as an aromatic amine are co-deposited with a mol rate of 1:1 and a pressure of $1 \times 10^{-4}$ to $4 \times 10^{-4}$ Pa, thereby a charge generating layer is formed. A quartz substrate is spun at a deposition rate of 0.4 nm/sec so as to be 50 nm in thickness. Here, a quartz substrate is used as a substrate which transmits light.

Subsequently, a charge acceptor layer is formed by depositing fullerene (C60) with a similar conditions by the vacuum vapor deposition.

Then, Al is deposited with a thickness of 200 nm and sealed with a glass substrate. A photo current can be observed by irradiating the substrate with light from the ITO side at a wavelength of 500 nm at which a charge transfer absorption of $MoO_3$ and α-NPD occurs, while applying a minute voltage between electrodes of the manufactured element.

It is to be noted that the substrate which transmits light may be a glass substrate, a quartz substrate, a plastic substrate and the like which transmit light. The plastic substrate is typically a substrate formed of polycarbonate (PC), ARTON formed of a norbornene resin with a polar group that is manufactured by JSR Corporation, polyethylene terephthalate (PET), polyether sulfone (PES), polyethylene naphthalate (PEN), nylon, polyether ether ketone (PEEK), polysulfone (PSF), polyetherimide (PEI), polyarylate (PAR), polybutylene terephthalate (PBT), polyimide, an organic material dispersed with inorganic particles with a diameter of several nm, and the like.

Embodiment 2

Figure 6:
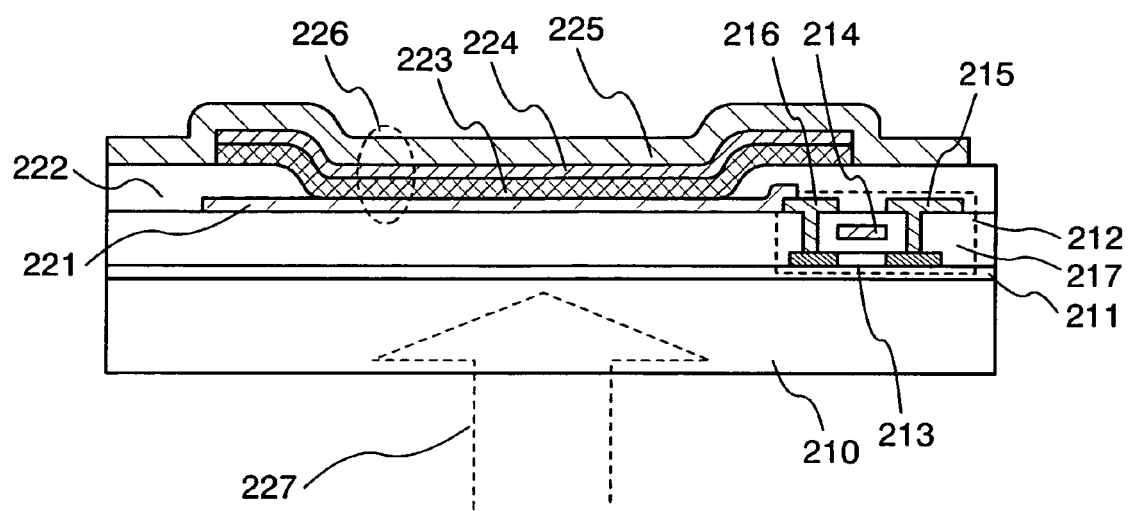
FIG. 6 is a schematic sectional view of a photoelectric conversion element.

Here, description is made with reference to FIG. 6 on a photoelectric conversion element having an amplifier circuit. It is to be noted that a TFT is used here as an element which forms the amplifier circuit, however, the invention is not limited to this and an operational amplifier and the like may also be used.

FIG. 6 shows a sectional view of a photoelectric conversion element. A first insulating layer 211 is formed over a substrate 210 which transmits light, and a TFT 212 is formed thereover. The TFT is formed of a semiconductor region 213 including a channel forming region, a source region, and a drain region, a gate electrode 214, a conductive layer 215 connected to the source region, and a conductive layer 216 connected to the drain region. The channel forming region, the gate electrode, the source electrode and the drain electrode of the TFT are insulated by a plurality of first interlayer insulating layers 217. In this embodiment mode, an n-channel TFT is used as the TFT 212. In FIG. 6, only one TFT is shown, however, a plurality of TFTs may be provided as well.

The semiconductor region of the TFT 212 may be formed of an amorphous semiconductor layer, a crystalline semiconductor layer, or a microcrystalline semiconductor layer. The amorphous semiconductor layer may be formed by a plasma CVD method, a low pressure CVD method, or the sputtering method. Further, a crystalline semiconductor layer may be formed by the aforementioned method and then a laser crystallization method, a thermal crystallization method, and the crystallization method described in Japanese Patent Laid-Open no. Hei 8-78329. According to the technique disclosed in the aforementioned patent application, a metal element to promote crystallization is selectively added to an amorphous silicon layer and thermal treatment is applied to form a semiconductor layer having a crystalline structure which spreads with an added region as a starting point. It is to be noted that the metal element is preferably removed after the crystallization in this treatment.

The microcrystalline semiconductor is a semiconductor having an intermediate structure between amorphous and crystalline structures (including a single crystal and a polycrystal), a third state which is stable in free energy, and a crystalline region with a short range order and a lattice distortion. At least a region of the microcrystalline layer has a crystal grain of 0.5 to 20 nm.

A microcrystalline semiconductor layer is formed of a silicon source gas by glow discharge decomposition (plasma CVD). As the silicon source gas, $SiH_4$, $Si_2H_6$, $SiH_2Cl_2$, $SiHCi_3$, $SiCl_4$, $SiF_4$ and the like are used.

A first electrode 221 connected to the conductive layer 216 connected to the source region or the drain region of a TFT is formed over a first interlayer insulating layer 217. An insulating layer 222 is formed over the first electrode 211. At least one of the first electrode 221 and a second electrode 225 transmits light.

A charge generating layer 223, a charge acceptor layer 224, and the second electrode 225 are sequentially stacked over the first electrode 211 and the insulating layer 222. The first electrode 221, the charge generating layer 223, the charge acceptor layer 224, and the second electrode 225 form a photoelectric conversion element 226. These structure and substance may appropriately employ the ones described in Embodiment Modes 1 to 3. Here, the first electrode 221 is formed of ITO and the charge generating layer 223 is formed of a layer in which α-NPD and molybdenum oxide are mixed, the charge acceptor layer 224 is formed of fullerene, and the second electrode 225 is formed of a titanium film. The photoelectric conversion element receives light 227 which transmits through the substrate 210 which transmits light.

A photoelectric conversion element can be formed by the aforementioned steps.

In this embodiment mode, a top gate TFT is used, however, the invention is not limited to this and a bottom gate TFT, an inversely staggered TFT and the like can also be used.

According to the invention, a photoelectric conversion element can be formed over an insulating substrate. The photoelectric conversion element in this embodiment has the amplifier circuit. Therefore, the photoelectric element can detect even minute light. Accordingly, a high performance photoelectric conversion element can be formed.

Embodiment 3

A manufacturing method of a solar battery having the photoelectric conversion element of the invention is described with reference to FIGS. 7A to 8.

Figure 7A:
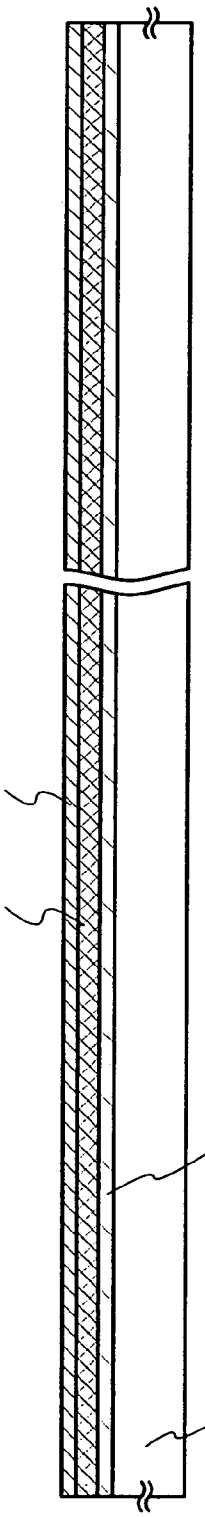
FIGS. 7A to 7C are schematic sectional views showing manufacturing steps of a solar battery.

In FIG. 7A, a substrate which transmits light is used as a substrate 100. Here, a glass substrate is used. It is to be noted that the substrate which transmits light described in Embodiment 3 is used as the substrate 100 appropriately.

The solar battery manufactured in this embodiment mode has a structure in which light is received by an opposite surface to a surface over which a photoelectric conversion layer is formed. First, the first electrode layer 101 is formed over the substrate 100. The first electrode layer 101 is formed of an indium tin oxide (ITO) alloy, zinc oxide (ZnO), tin oxide ($SnO_2$), an ITO alloy containing ZnO and the like with a thickness of 40 to 200 nm (preferably 50 to 100 nm). However, the highest temperature at which the aforementioned organic resin material can be continuously used is 200° C. or lower. Therefore, the first electrode layer 101 is formed by the sputtering method, the vacuum vapor deposition method and the like so that a substrate temperature at deposition is to be about from a room temperature to 150° C. The detailed manufacturing conditions may be determined at an operator's discretion.

An ITO film is suitable in view of low resistance of the first electrode layer, however, ITO is reduced by the hydrogenation in a subsequent step, thereby the film does not transmit light. To prevent this, a $SnO_2$ film and a ZnO film may be formed over the ITO film. A ZnO (ZnO:Ga) film containing 1 to 10 wt % of gallium (Ga) has high transmissivity and is a favorable material to be stacked over the ITO film. The combination which can provide favorable light transmissivity is, for example, an ITO film with a thickness of 50 to 60 nm and a ZnO:Ga film with a thickness of 25 nm formed thereover.

Subsequently, molybdenum oxide $MoO_3$ as a metal oxide and α-NPD as aromatic amine are co-deposited as a charge generating layer at a mol rate of 1:1 and a pressure of $1\times10^{-4}$ to $4\times10^{-4}$ Pa.

Then, fullerene (C60) is formed as a charge acceptor layer with similar conditions by the vacuum vapor deposition.

In this embodiment, Embodiment Mode 1 is applied as the charge generating layer and the charge acceptor layer, however, Embodiment Mode 2 or 3 may be applied at discretion.

Figure 7B:
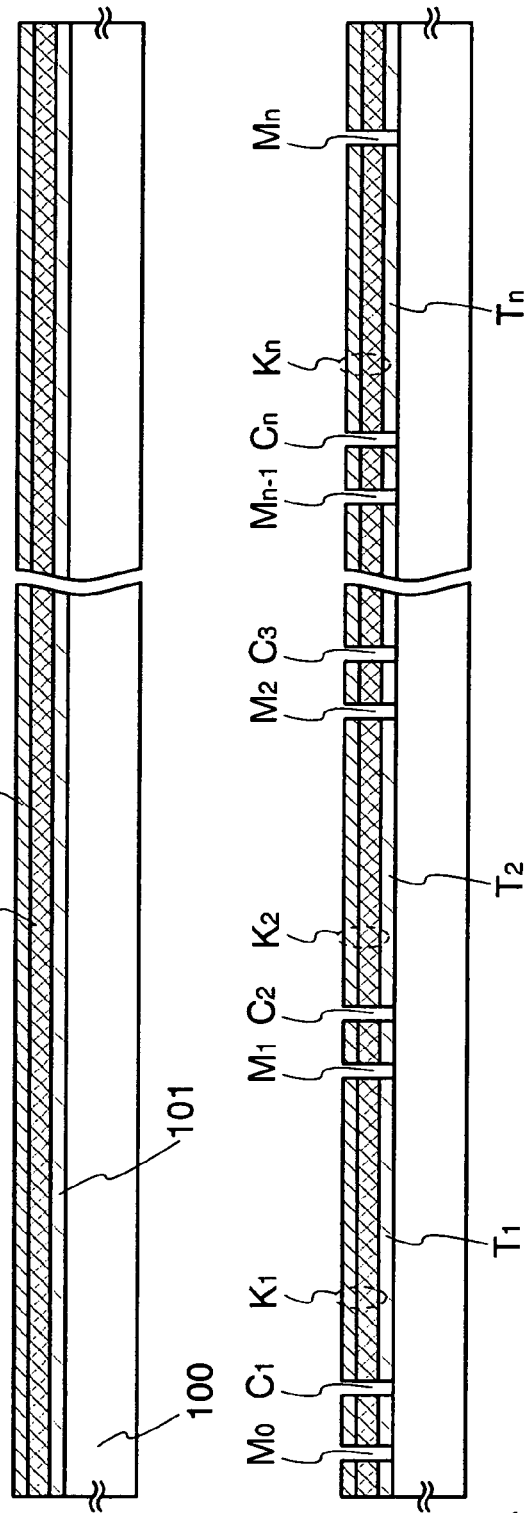

As shown in FIG. 7B, apertures $M_0$ to $M_n$ and $C_1$ to $C_n$ are formed from the charge acceptor layer 103 to reach the first electrode layer 101 by a laser processing method to form a plurality of unit cells over the same substrate. The apertures $M_0$ to $M_n$ are apertures for electrical isolation, which form unit cells. The apertures $C_1$ to $C_n$ are provided for connecting a first electrode and a second electrode. In the laser processing method, any kind of laser may be used, however, an Nd-YAG laser, an excimer laser and the like are used. In any cases, by applying a laser process with the first electrode layer 101 and the charge acceptor layer 103 stacked, it can be prevented that a first electrode layer is peeled off the substrate in the process.

Figure 7C:
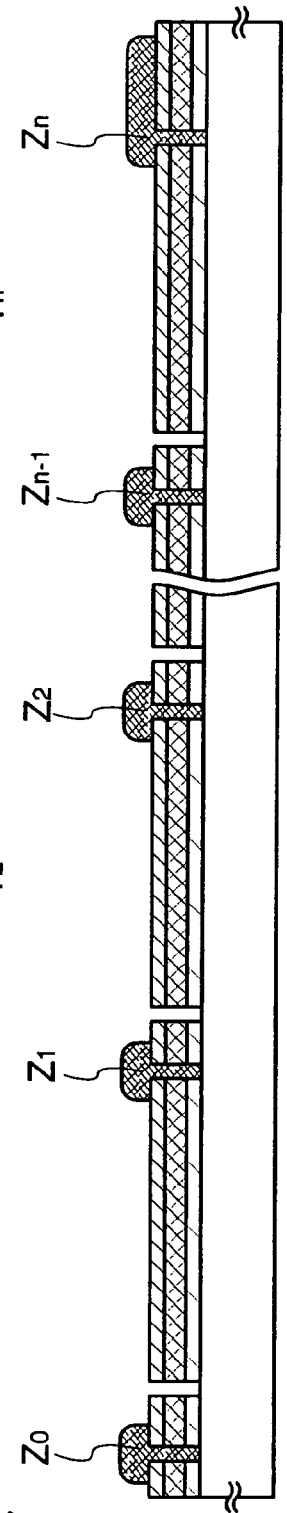

In this manner, the first electrode layer 101 is divided into $T_1$ to $T_n$ and the photoelectric conversion element layer is divided into $K_1$ to $K_n$. Then, the apertures $M_0$ to $M_n$ are filled and insulating resin layers $Z_0$ to $Z_n$ are formed to cover top portions thereof as shown in FIG. 7C.

The insulating resin layers $Z_0$ to $Z_n$ are formed by a screen printing method and heating.

Figure 8:
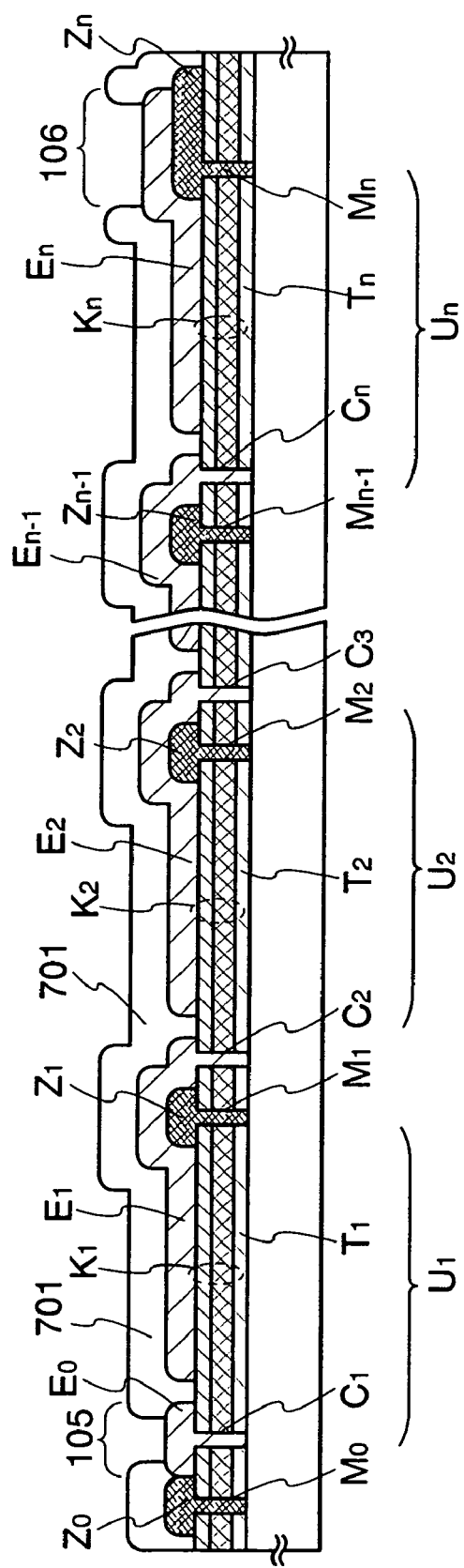
FIG. 8 is a schematic sectional view showing a manufacturing step of a solar battery.

Subsequently, a conductive carbon paste is printed into a predetermined pattern by the screen printing method, leveled, dried, and then firmly hardened at 150° C. for 30 minutes to form second electrode layers $E_0$ to $E_n$ as shown in FIG. 8.

Each of the second electrode layers $E_0$ to $E_n$ is formed so as to be connected to each of the first electrode layers $T_1$ to $T_n$ through each of the apertures $C_1$ to $C_{n-1}$, respectively. The apertures $C_1$ to $C_n$ are filled with the same material as the second electrode. In this manner, the second electrode $E_{n-1}$ is electrically connected to the first electrode $T_n$.

At last, an epoxy resin is formed by a printing method and thermal treatment, thereby a sealing resin layer 701 is formed. The sealing resin layer 701 is connected to a circuit substrate through apertures 105 and 106 formed over the second electrodes $E_0$ and $E_n$.

In this manner, a unit cell formed of the first electrode $T_n$, the photoelectric conversion element layer $K_n$, and the second electrode layer $E_n$ is formed over the substrate 100. The adjacent second electrode $E_{n-1}$ is connected to the first electrode $T_n$ through the aperture $C_n$, thereby n solar batteries connected in series can be manufactured. The second electrode $E_0$ becomes a lead electrode of the first electrode $T_1$ in a unit cell $U_1$.

Embodiment 4

Figure 9A:
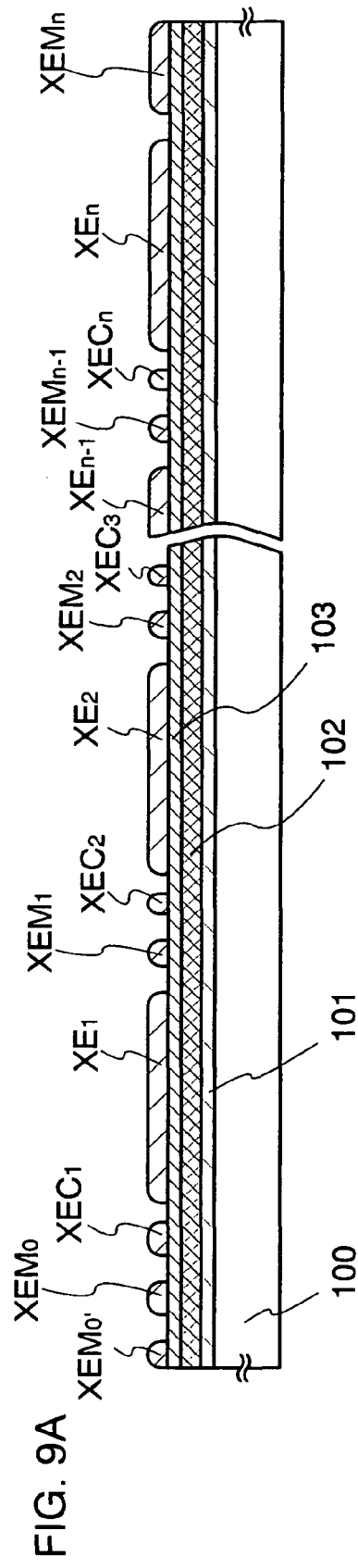
FIGS. 9A to 9C are schematic sectional views showing manufacturing steps of a solar battery.
Figure 9B:
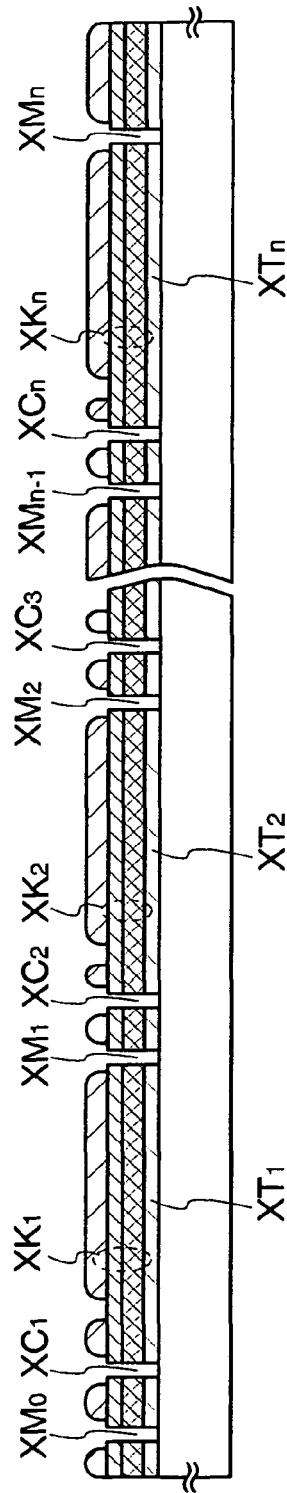
Figure 9C:
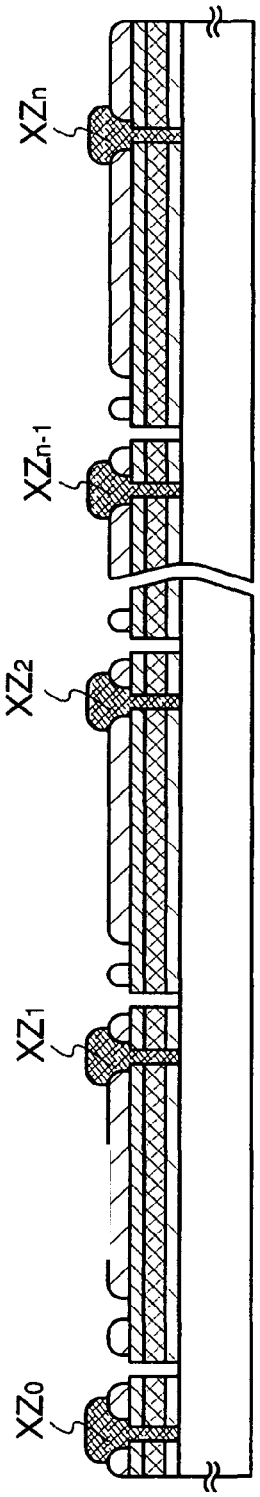
Figure 10:
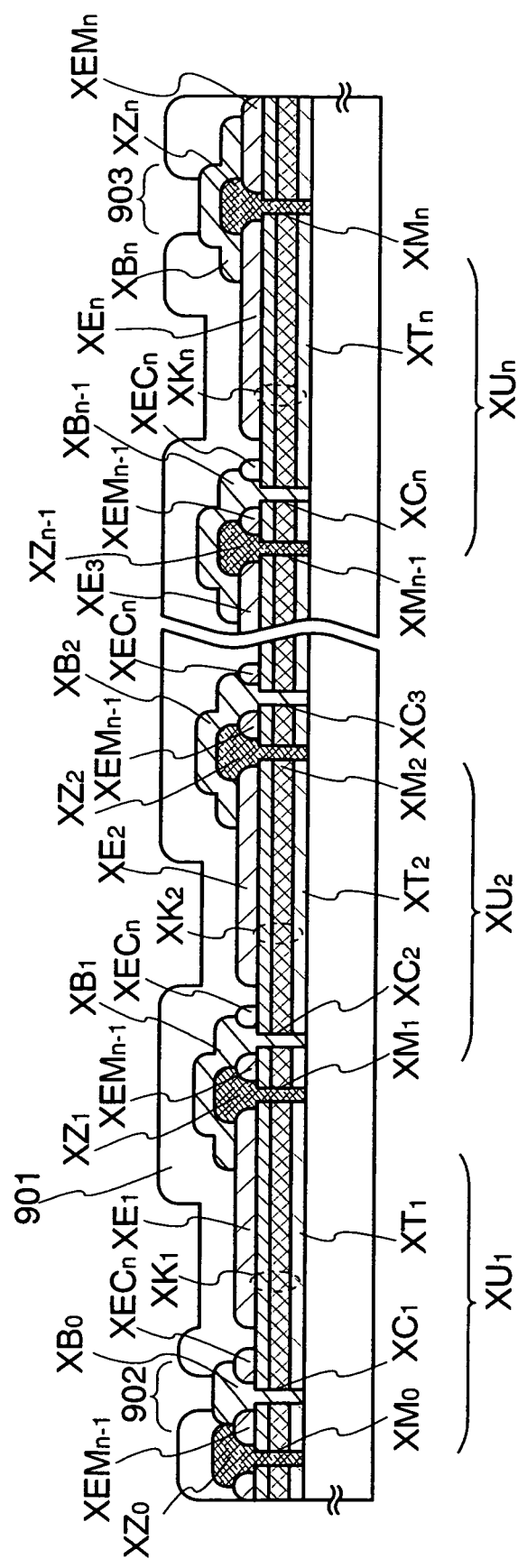
FIG. 10 is a schematic sectional view showing a manufacturing step of a solar battery.

Description is made with reference to FIGS. 9A to 10 on manufacturing steps of another solar battery of the invention. In FIG. 9A, the substrate 100, the first electrode 101, the charge generating layer 102, and the charge acceptor layer 103 are formed similarly to Embodiment 3. Then, second electrodes $XE_{M0}$ to $XE_{Mn}$ are formed over the charge acceptor layer 103 by the screen printing method similarly to Embodiment 3.

Subsequently, apertures $XM_0$ to $XM_n$ and $XC_1$ to $XC_n$ are formed from the charge acceptor layer 103 to reach the first electrode layer 101 by the laser processing method as shown in FIG. 9B. The apertures $XM_0$ to $XM_n$ are apertures for electrical isolation, to form unit cells. The apertures $XC_1$ to $XC_n$ are provided for connecting a first electrode and a second electrode.

A residue may remain in the periphery of the apertures in the laser process. This residue is a spray of a processed material and undesirable since the spray heated up to a high temperature by laser light attaches to the surface of the charge acceptor layer 103 and damages the film. In order to prevent this, a second electrode is formed in accordance with a pattern of the apertures and processed by laser, and thus at least a damage to the charge acceptor layer 103 can be prevented.

After dividing the first electrode layer 101 into $XT_1$ to $XT_n$ and dividing the charge generating layer 102 and the charge acceptor layer 103 into $XK_1$ to $XK_n$, the apertures $XM_0$ to $XM_n$ are filled and insulating resin layers $XZ_0$ to $XZ_n$ are formed by the screen printing method to cover top portions of the apertures $XM_0$ to $XM_n$ as shown in FIG. 9C.

Subsequently, wirings $XB_0$ to $XB_{n-1}$ to be connected to the first electrodes $XT_1$ to $XT_n$ are formed by the screen printing method to fill the apertures $XC_1$ to $XC_n$ as shown in FIG. 10. The wirings $XB_0$ to $XB_{n-1}$ are formed of the same material as the second electrode, which is a heat curable carbon paste. In this manner, the second electrode $XEM_{n-1}$ is electrically connected to the first electrode $XT_n$ respectively.

At last, a sealing resin layer 901 is formed by the printing method. In the sealing resin layer 901, apertures 902 and 903 are formed over the wirings $XB_0$ and $XB_n$ respectively, through which the substrate is connected to an external circuit. In this manner, unit cells formed of the first electrode $XT_n$, the photoelectric conversion element layer $XK_n$, and the second electrode layer $XE_n$ are formed over the substrate 100. The adjacent second electrode $XEM_{n-1}$ is connected to the first electrode $XT_n$ through the aperture $XC_n$, thereby n solar batteries connected in series can be manufactured. The wiring $XB_0$ becomes a lead electrode of the first electrode $XT_1$ in a unit cell $XU_1$.

Embodiment 5

Figure 5A:
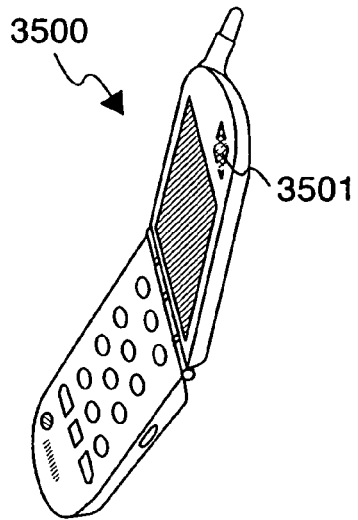
FIGS. 5A to 5E are perspective views of electronic devices to which the invention can be applied.
Figure 5B:
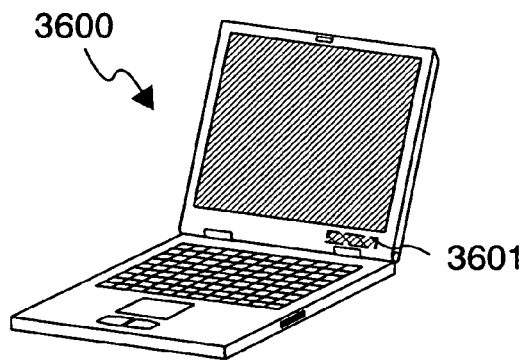
Figure 5C:
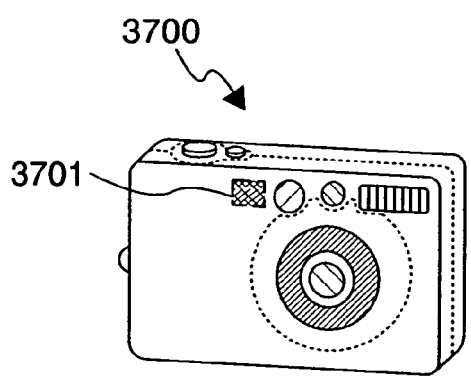
Figure 5D:
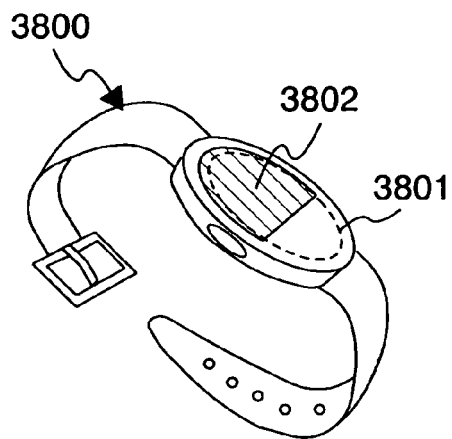
Figure 5E:
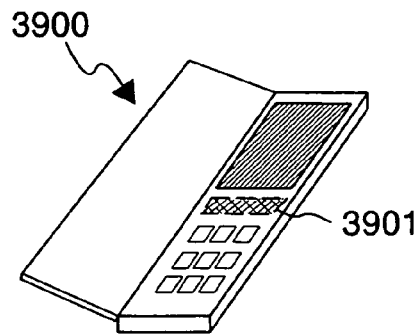

By incorporating a photoelectric conversion element or a solar battery having the photoelectric conversion element manufactured according to the invention, various electronic devices can be manufactured. For example, the electronic devices are a portable phone 3500 as shown in FIG. 5A, a personal computer 3600 as shown in FIG. 5B, a game machine, a navigation system, a portable audio set, a handy AV device, a camera 3700 as shown in FIG. 5C such as a digital camera, a film camera, and an instant camera, a room air conditioner, a car air conditioner, air ventilation/conditioning equipment, an electrical pot, a CRT projection TV, lighting, light fixture, a wrist watch 3800 as shown in FIG. 5D, a calculator 3900 as shown in FIG. 5E, and the like. Specific examples of these electronic devices are described below.

A photoelectric conversion element of the invention, which is used as sensors 3501, 3601, and 3901 for controlling the optimal luminance of a display, intensity and ON/OFF of a backlight and saving a battery, can be used for the portable phone 3500, a digital camera, a game machine, a navigation system, a portable audio device, the personal computer 3600, the calculator 3900 and the like. Further, a solar battery having the photoelectric conversion element can be provided in these electronic devices as a battery. A photoelectric conversion element or a solar battery having the photoelectric conversion element of the invention can improve energy conversion efficiency, therefore, a compact electronic device can be provided.

Further, a photoelectric conversion element of the invention can be mounted in the camera 3700 such as a digital camera, a film camera, and an instant camera as a sensor 3701 for controlling flash light and an aperture. Further, a solar battery having the photoelectric conversion element can be provided in these electronic devices as a battery. A photoelectric conversion element or a solar battery having the photoelectric conversion element of the invention can improve energy conversion efficiency, therefore, a compact electronic device can be provided.

Further, a photoelectric conversion element of the invention can be mounted as a sensor for controlling the amount of air and temperature in an air conditioner represented by room and car air conditioners, and an air ventilation/conditioning equipment. A photoelectric conversion element or a solar battery having the photoelectric conversion element of the invention can improve energy conversion efficiency, therefore, a compact electronic device can be provided and low power consumption can be realized.

Further, a photoelectric conversion element of the invention can be mounted in an electric pot as a sensor for controlling a heat-retention temperature. By using a photo sensor of the invention, a heat-retention temperature can be set low after the room light is turned off. Further, as energy conversion efficiency can be improved, compactness and thin design can be achieved, therefore, the invention can be mounted in any place. As a result, low power consumption can be realized.

Further, a photoelectric conversion element of the invention can be mounted as a sensor for controlling a scan line positioning (aligning RGB scan lines (Digital Auto Convergence)) sensor in a display of a CRT projection TV. According to a photoelectric conversion element or a solar battery of the invention, energy conversion efficiency can be improved, therefore, a compact electronic device can be realized. In addition, the sensor can be mounted in any region. Further, rapid automatic control of a CRT projection TV can be achieved.

Further, a solar battery having the photoelectric conversion element of the invention can be provided as a battery 3801 for a watch such as the wrist watch 3800 and a wall clock. In FIG. 5D, the battery 3801 is provided under an hour plate 3802. A photoelectric conversion element or a solar battery having the photoelectric conversion element of the invention can improve energy conversion efficiency, therefore, a compact electronic device can be provided.

A photoelectric conversion element of the invention can be used as a sensor for controlling ON/OFF of various lighting and light fixture, for home lighting, outdoor light, street light, an unmanned public place, an athletic field, a vehicle, and the like. By using a sensor of the invention, low power consumption can be realized. Further, by providing a solar battery of the invention to these electronic devices, energy conversion efficiency can be improved, and thus a battery can be formed thinner. As a result, a compact electronic device can be provided.

Embodiment 6

Figure 11A:
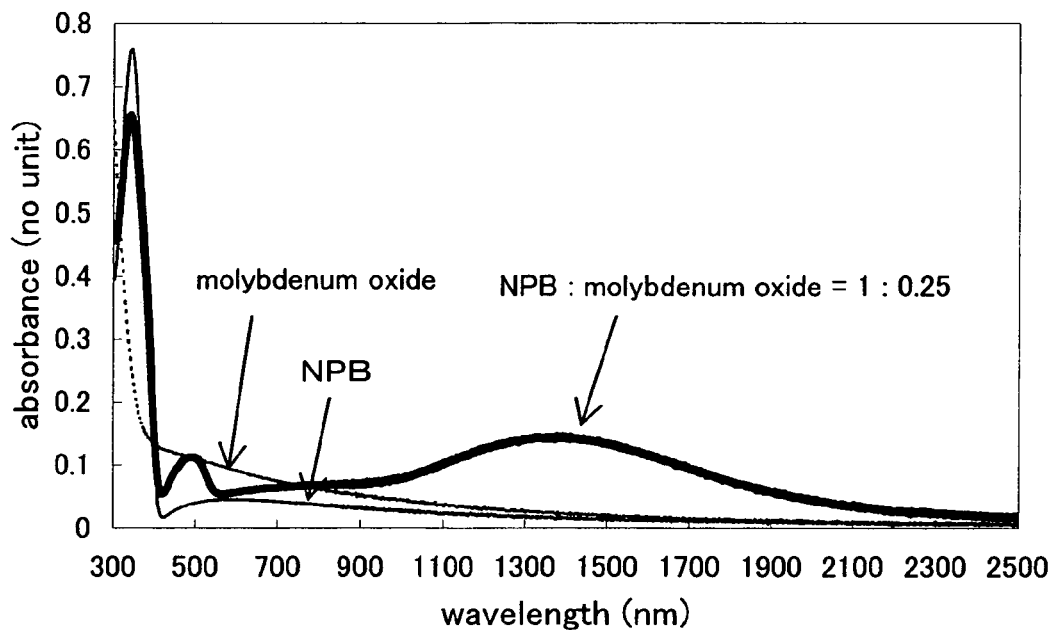
FIGS. 11A and 11B show absorption spectra indicating charge separation.
Figure 11B:
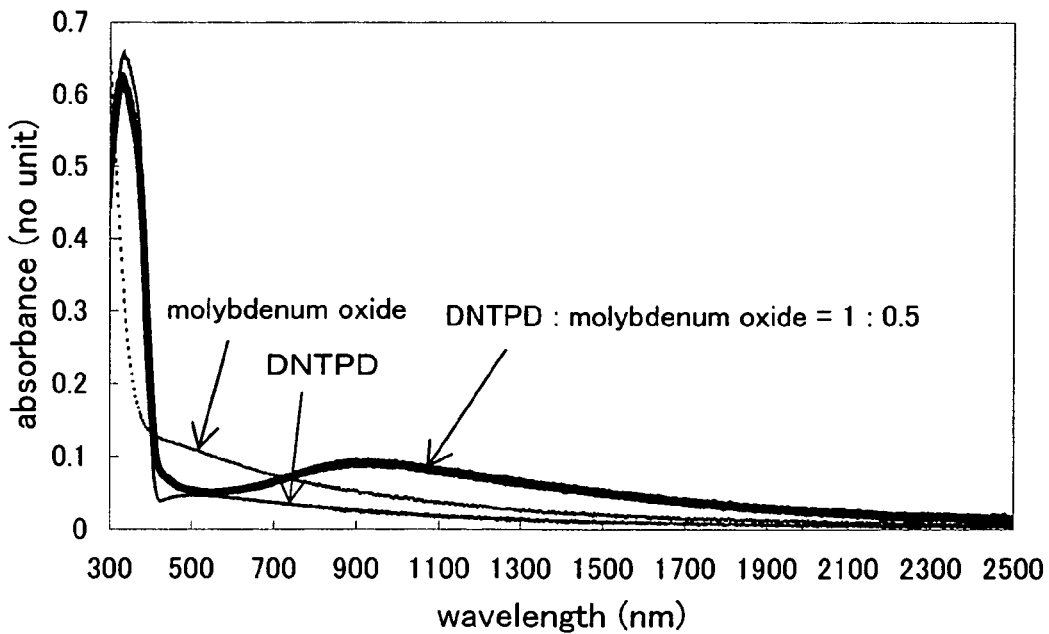

Measurement was taken of the absorption spectrum of each of samples (1) and (4) in which a compound layer containing an organic compound having an aromatic amine skeleton and a metal oxide is formed over a glass substrate by the co-deposition method, samples (2) and (5) in which a layer formed of only an organic compound having an aromatic amine skeleton is formed over a glass substrate by the vapor deposition method, and a sample (3) in which a layer formed of a metal oxide is formed over a glass substrate by the vapor deposition method. As a result, it was found out that absorption caused by charge transfer was seen in a wavelength region of 1000 to 1900 nm in the sample (1) and 900 to 1200 nm in the sample (4). In this embodiment, NPB or DNTPD as the organic compound having an aromatic amine skeleton and molybdenum oxide as the metal oxide are used for forming each layer with a thickness of 100 nm so that weight ratios become 4:1 (=NPB:molybdenum oxide) in the sample (1) and 4:2 (=DNTPD:molybdenum oxide) in the sample (4). FIGS. 11A and 11B show a measurement result of the absorption spectrum of each sample. In FIGS. 11A and 11B, the abscissa shows a wavelength (nm) while the ordinate shows an absorbance (no unit of quantity required).

Embodiment 7

Measurement by an electron spin resonance (ESR) method was taken of samples (6) and (9) in which a compound layer containing an organic compound having an aromatic amine skeleton and a metal oxide is formed over a quartz substrate by the co-deposition method, and samples (7) and (10) in which a layer formed of only an organic compound having an aromatic amine skeleton is formed over a quartz substrate by the vapor deposition method at a room temperature. As a result, it was found out that the compound layer containing an organic compound having an aromatic amine skeleton and a metal oxide had an unpaired electron, that is, a charge transfer complex is generated. In this embodiment, NPB or DNTPD as the organic compound having an aromatic amine skeleton and a molybdenum oxide as the metal element were used for forming each layer with a thickness of 200 nm so that weight ratios become 1:0.25 (=NPB:molybdenum oxide) in the sample (6) and 1:0.5 (=DNTPD:molybdenum oxide) in the sample (9). FIGS. 12A to 12C and 13A and 13B show a measurement result of each sample. The g value of the sample (6) was 2.0024 while the g value of the sample (9) was 2.0025.

This application is based on Japanese Patent Application serial no. 2004-353437 filed in Japan Patent Office on 6th, Dec. 2004, the entire contents of which are hereby incorporated by reference.

What is claimed is:

1. A photoelectric conversion element comprising:
a substrate;
a first electrode over the substrate;
a first charge generating layer provided over the first electrode;
a second charge generating layer provided over and direct contact with the first charge generating layer; and
a second electrode over the second charge generating layer,
wherein the first charge generating layer comprises a first organic compound and a first inorganic compound which has an electron accepting property with respect to the first organic compound,
wherein the second charge generating layer comprises a second organic compound and a second inorganic compound which has an electron donating property with respect to the second organic compound,
wherein the first organic compound and the first inorganic compound are selected so that a first charge transfer complex is formed in the first charge generating layer, and
wherein the second organic compound and the second inorganic compound are selected so that a second charge transfer complex is formed in the second charge generating layer.

2. The photoelectric conversion element according to claim 1,
wherein the substrate and the first electrode transmit light.

3. The photoelectric conversion element according to claim 1,
wherein the first organic compound is an organic compound having a hole transporting property.

4. The photoelectric conversion element according to claim 3,
wherein the organic compound having the hole transporting property has an aromatic amine skeleton.

5. The photoelectric conversion element according to claim 1,
wherein the first inorganic compound is a metal oxide or a metal nitride.

6. The photoelectric conversion element according to claim 5,
wherein the metal oxide is an oxide of a transition metal belonging to any one of groups 4 to 10 of the periodic table.

7. The photoelectric conversion element according to claim 5,
wherein the metal oxide is selected from the group consisting of molybdenum oxide, vanadium oxide, ruthenium oxide, and rhenium oxide.

8. The photoelectric conversion element according to claim 1,
wherein the second organic compound is an organic compound having an electron transporting property.

9. The photoelectric conversion element according to claim 8,
wherein the organic compound having the electron transporting property is selected from the group consisting of a chelate metal complex having a chelate ligand comprising an aromatic ring, an organic compound having a phenanthroline skeleton, an organic compound having an oxadiazol skeleton, a perylene derivative, a naphthalene derivative, quinones, a viologen derivative, or a fullerene.

10. The photoelectric conversion element according to claim 1,
wherein the second inorganic compound is a metal oxide selected from an alkali metal oxide, an alkaline earth metal oxide, and a rare earth metal oxide or a metal nitride selected from an alkali metal nitride, an alkaline earth metal nitride, and a rare earth metal nitride.

11. The photoelectric conversion element according to claim 10,
wherein the metal oxide is selected from the group consisting of lithium oxide, calcium oxide, sodium oxide, and barium oxide.

12. The photoelectric conversion element according to claim 10,
wherein the metal nitride is selected from the group consisting of lithium nitride, magnesium nitride, and calcium nitride.

13. A solar battery using the photoelectric conversion element according to claim 1.

14. A photo sensor using the photoelectric conversion element according to claim 1.

15. The photoelectric conversion element according to claim 5, wherein the metal oxide is $MoO_3$.

16. A lighting having the photoelectric conversion element according to claim 1.

17. A light fixture having the photoelectric conversion element according to claim 1.

* * * * *